(12) United States Patent  
Hoshino et al.

(10) Patent No.: US 8,219,054 B2
(45) Date of Patent: Jul. 10, 2012

(54) OSCILLATING CIRCUIT AND RADIO COMMUNICATION APPARATUS

(75) Inventors: Hiroaki Hoshino, Yokohama (JP); Toshiya Mitomo, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 361 days.

(21) Appl. No.: 12/558,769

(22) Filed: Sep. 14, 2009

(65) Prior Publication Data

US 2010/0233976 A1  Sep. 16, 2010

(30) Foreign Application Priority Data

Mar. 16, 2009  (JP) .................................. 2009-063088

(51) Int. Cl.
*H04B 1/16* (2006.01)
(52) U.S. Cl. ........ 455/209; 455/131; 455/147; 455/148; 455/180.3; 331/135; 331/107; 331/108; 331/114
(58) Field of Classification Search .................. 455/131, 455/147, 148, 180.3, 209, 236.1, 260, 255, 455/264, 265; 331/135, 46, 47, 52, 57, 107, 108, 114, 117, 167
See application file for complete search history.

(56) References Cited

U.S. PATENT DOCUMENTS

2002/0111152 A1*  8/2002  Razavi et al. ................. 455/326

OTHER PUBLICATIONS

Ren-Chieh Liu, et al. A 63GHz VCO Using a Standard 0.25um CMOS Process, IEEE International Solid-Sate Circuits Conference, pp. 446-447, 2004.

* cited by examiner

*Primary Examiner* — Tuan Pham
(74) *Attorney, Agent, or Firm* — Turocy & Watson, LLP (57) ABSTRACT

According to an aspect of the invention, an oscillating circuit includes: a first MOS transistor having a first drain terminal and a first source terminal; a load element connected to the first drain terminal; and an oscillator connected to the first source terminal and outputs a fundamental signal and a harmonic signal, wherein the harmonic signal is amplified so that the amplified harmonic signal is output from the first drain terminal.

8 Claims, 10 Drawing Sheets

OSCILLATING CIRCUIT AND RADIO COMMUNICATION APPARATUS

CROSS-REFERENCE TO RELATED APPLICATIONS

This application is based upon and claims the benefit of priority from Japanese Patent Application No. 2009-063088, filed Mar. 16, 2009, the entire contents of which are incorporated herein by reference.

BACKGROUND

1. Field

The present invention relates to an oscillating circuit and a radio communication apparatus.

2. Description of the Related Art

There is known a method using a VCO (Voltage-Controlled Oscillator) circuit as a local oscillator in a radio communication apparatus. As for a harmonic of an oscillation frequency, there is generally known a push-push VCO which obtains a harmonic frequency by inserting an inductor or a transmission line, which exhibits high impedance at the harmonic frequency, between a midpoint portion of inductors and a power supply in order to obtain a harmonic of an oscillation frequency in an LC resonance type VCO (e.g. see Ren-Chieh Liu, Hong-Yeh Chang, Chi-Hsueh Wang, Huei Wang, "A 63 GHz VCO Using a Standard 0.2 μm CMOS Process," IEEE International Solid-State Circuits Conference, pp. 446-447, 2004)

In the aforementioned method of the above Non Patent Document, the amplitude of the harmonic signal is however small, or an additional amplifier is required.

SUMMARY OF THE INVENTION

According to an aspect of the present invention, there is provided an oscillating circuit including: a first MOS transistor having a first drain terminal and a first source terminal; a load element connected to the first drain terminal; and an oscillator connected to the first source terminal and outputs a fundamental signal and a harmonic signal, wherein the harmonic signal is amplified so that the amplified harmonic signal is output from the first drain terminal.

DETAILED DESCRIPTION

Embodiments of the invention will be described below with reference to the drawings. In FIGS. 1 to 8, like numerals or like names even with different numerals refer to like parts if there is no special notice. Duplicate description will be avoided.

First Embodiment

Figure 1:
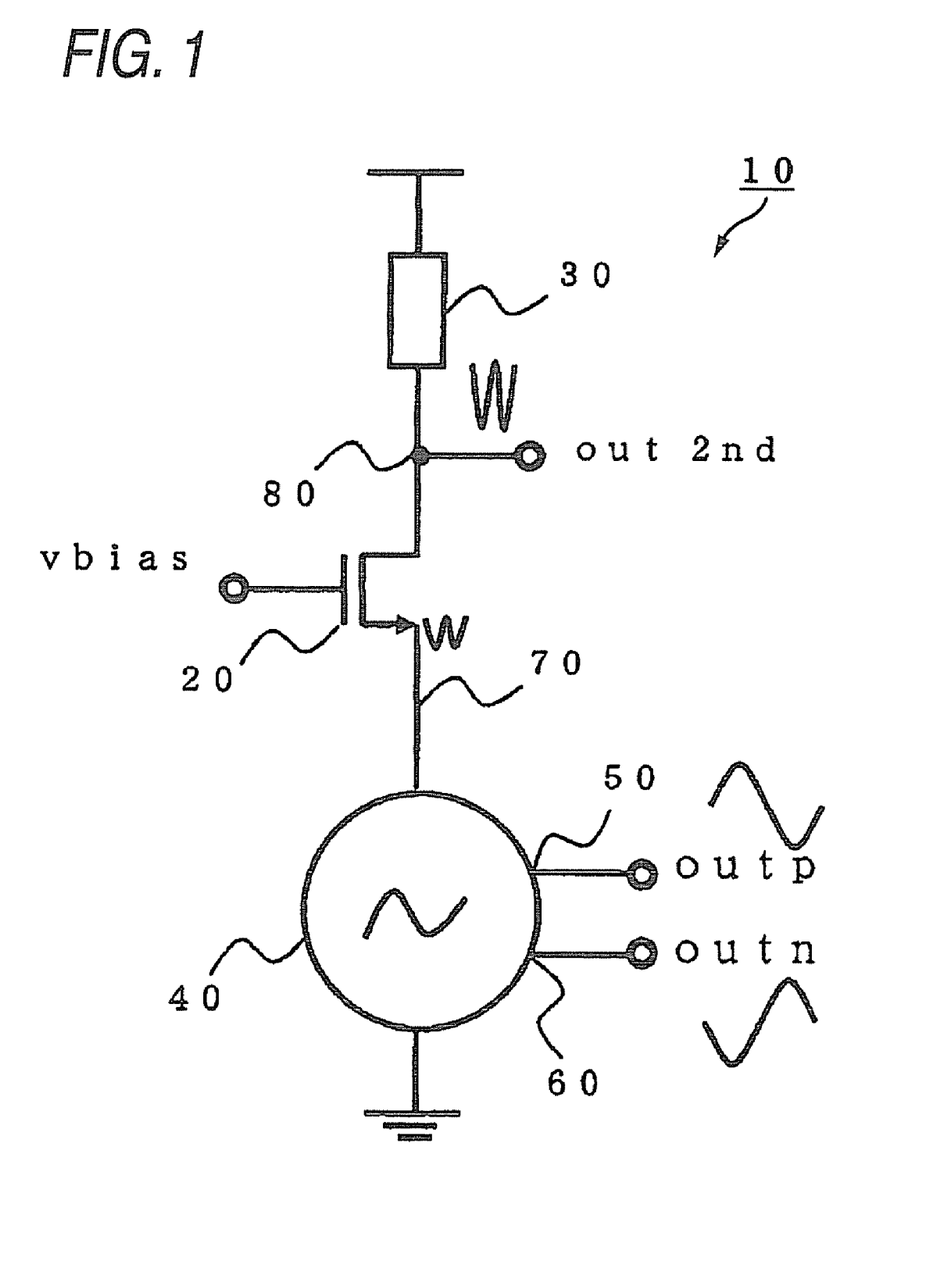
FIG. 1 is a circuit diagram showing a configuration of an oscillator according to a first embodiment.

FIG. 1 shows a circuit diagram of an oscillator according to a first embodiment of the invention.

The oscillator 10 shown in this embodiment is configured so that a load element 30 is connected to a drain terminal 80 of an NMOS transistor 20 (which may be called n-type MOS transistor) and a fundamental oscillator 40 is connected to a source terminal 70 of the NMOS transistor 20.

The fundamental oscillator 40 outputs an oscillation signal (hereinafter referred to as positive phase signal) at a first output terminal 50 and outputs a negative phase signal at a second output terminal 60 so that the phase of the negative phase signal is 180° shifted from the phase of the positive phase signal. Examples of circuit configuration of the fundamental oscillator 40 include a Colpitts oscillator, a Hartley oscillator, a negative-resistance oscillator, a ring oscillator, etc.

The load element 30 means an element such as an inductor, a transmission line, etc. exhibiting impedance at a high frequency.

The fundamental oscillator 40 permits a harmonic signal to be output from the source terminal 70 of the NMOS transistor 20. The NMOS transistor 20 and the load element 30 serve as a common-gate amplifier which amplifies the amplitude of the harmonic signal output from the terminal 70 so that the amplified harmonic signal can be output at the drain terminal 80.

This can be explained as follows. Because a gate voltage vbias (electric potential) of the NMOS transistor 20 is constant, a current flowing in the NMOS transistor 20 changes as the gate-source voltage of the NMOS transistor 20 changes. Because the current flowing in the NMOS transistor 20 further flows in the load element 30, the signal obtained by amplifying the amplitude of the harmonic signal output at the terminal 70 can be output at the terminal 80.

Figure 2A:
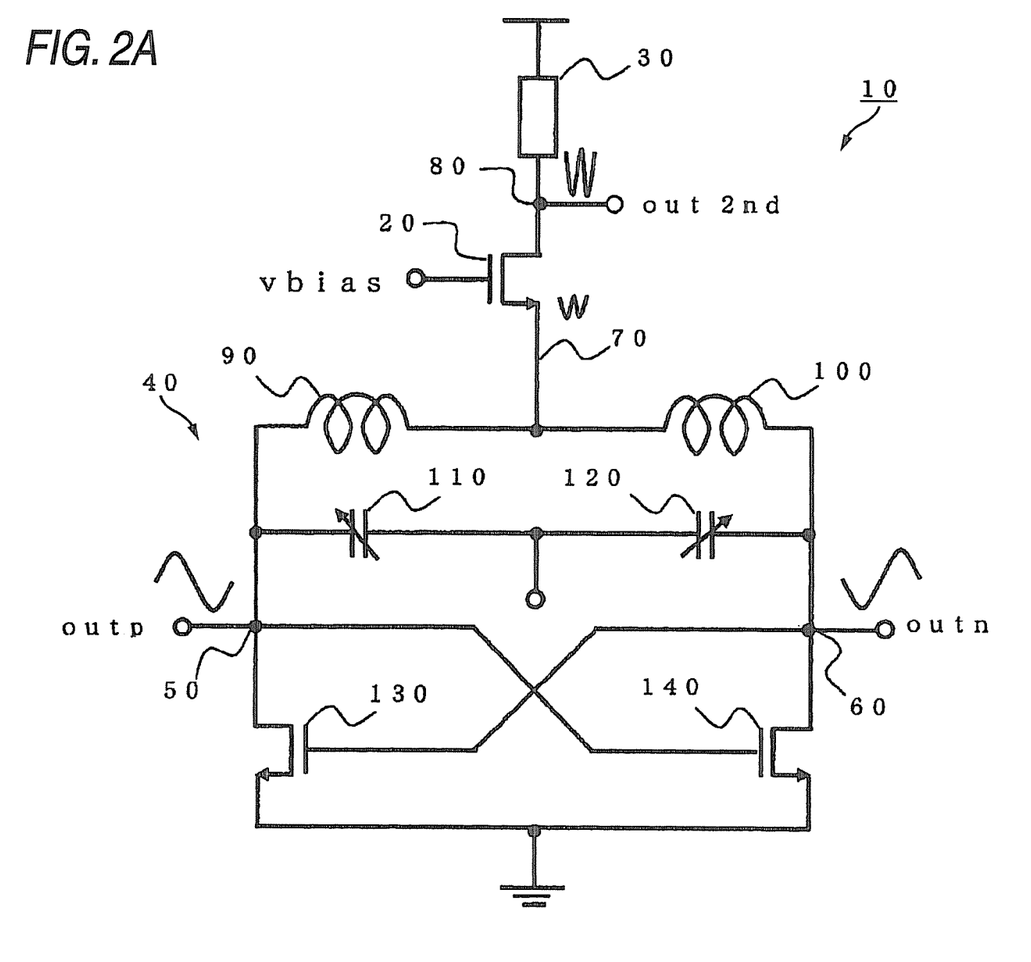
FIG. 2A is a circuit diagram showing a detailed configuration of the oscillator according to the first embodiment.

Referring to FIG. 2A, a detailed circuit configuration of the fundamental oscillator 40 will be described next.

FIG. 2A shows a circuit of the oscillator 10 as an example of the invention, in which a differential negative-resistance oscillator is used as the fundamental oscillator 40 in FIG. 1 so that a second harmonic can be output.

The circuit shown in FIG. 2A is configured similarly to that in FIG. 1 so that the load element 30 is connected to the drain terminal of the NMOS transistor 20 and the fundament oscillator 40 is connected to the source terminal of the NMOS transistor 20.

The fundamental oscillator 40 includes a series circuit of two inductors 90 and 100, and a series circuit of two capacitors 110 and 120. The series circuit of the two capacitors 110 and 120 is connected in parallel to the series circuit of the two inductors 90 and 100.

These inductors and capacitors operate as an LC resonance circuit. The LC resonance circuit oscillates at a resonance frequency defined by inductance of the two inductors 90 and 100 and capacitance of the two capacitors 110 and 120.

A drain terminal of an NMOS transistor 130 is connected to the inductor 90 and the capacitor 110 while a drain terminal of an NMOS transistor 140 is connected to the inductor 100 and the capacitor 120. A gate terminal of the NMOS transistor 130 is connected to the inductor 100 and the capacitor 120 while a gate terminal of the NMOS transistor 140 is connected to the inductor 90 and the capacitor 110. Respective source terminals of the NMOS transistors 130 and 140 are grounded. A source terminal of the NMOS transistor 20 is connected to a midpoint of the series circuit of the two inductors 90 and 100.

The NMOS transistors 130 and 140 operate as negative resistance which compensates for loss in the LC resonance circuit made from the inductors 90 and 100 and the capacitors 110 and 120 to thereby continue oscillation of the LC resonance circuit.

The oscillation frequency of the fundamental oscillator 40 is given by the following expression (1):

[Numeral 1]

$$f_0 = \frac{1}{2\pi\sqrt{L \cdot C_{total}}} \quad (1)$$

in which $f_0$ is an oscillation frequency, L is an inductance, and $C_{total}$ is a total capacitance inclusive of capacitance and parasitic capacitance of the inductors and the transistors.

The oscillation signal with the frequency $f_0$ is output as a positive phase signal from the drain terminal 50 of the NMOS transistor 130 and output as a negative phase signal from the drain terminal 60 of the NMOS transistor 140. The signals output from the terminals 50 and 60 operate in a differential manner. For this reason, not odd-number order harmonic signals but only even-number order harmonic signals appear at the source terminal 70 of the NMOS transistor 20. Of the even-number order harmonic signals, only a second harmonic is considered now. It is generally known that signal strength of a harmonic decreases as the order of the harmonic increases from a second harmonic to a higher order harmonic. Incidentally, if the configuration according to this embodiment is used, it is possible to output a higher order harmonic than the second harmonic, as well as the second harmonic. For example, a fourth harmonic can be output if the value of the load element 30 is adjusted to increase impedance at the frequency of the fourth harmonic.

Figure 2B:
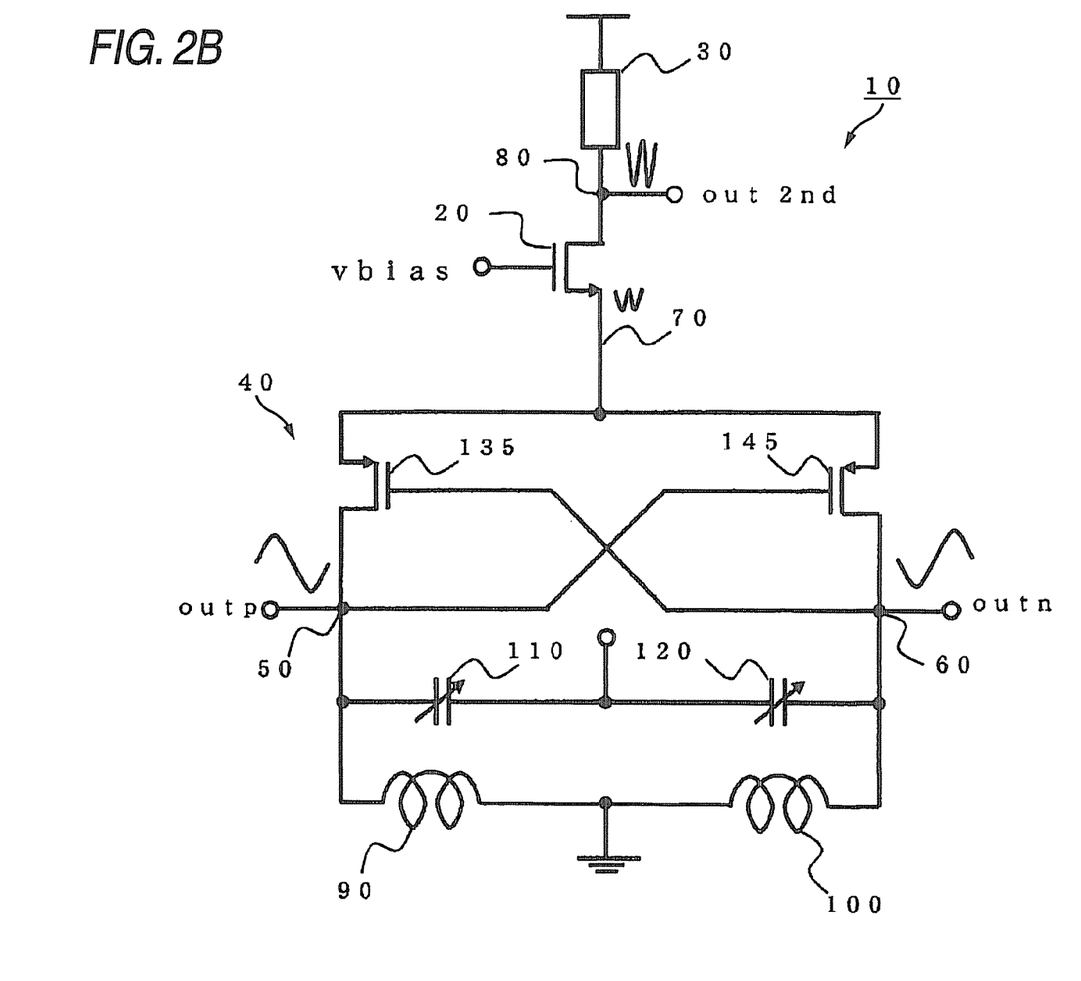
FIG. 2B is a modification of the oscillator according to the first embodiment.

As shown in FIG. 2B, the fundamental oscillator 40 according to this embodiment may be configured so that the source terminal of the NMOS transistor 20 is connected to a midpoint between a source terminal of a PMOS transistor 135 and a source terminal of a PMOS transistor 145. That is, the fundamental oscillator 40 is configured so that the source terminal of the NMOS transistor 20 is connected to a midpoint of a differential circuit. The midpoint of the differential circuit means a midpoint between capacitors 110 and 120 as constituent members of the fundamental oscillator 40, a midpoint between inductors 90 and 100 as constituent members of the fundamental oscillator 40 or a midpoint between source terminals of NMOS transistors 130 and 140 (or PMOS transistors 135 and 145) as constituent members of the fundamental oscillator 40.

Figure 3A:
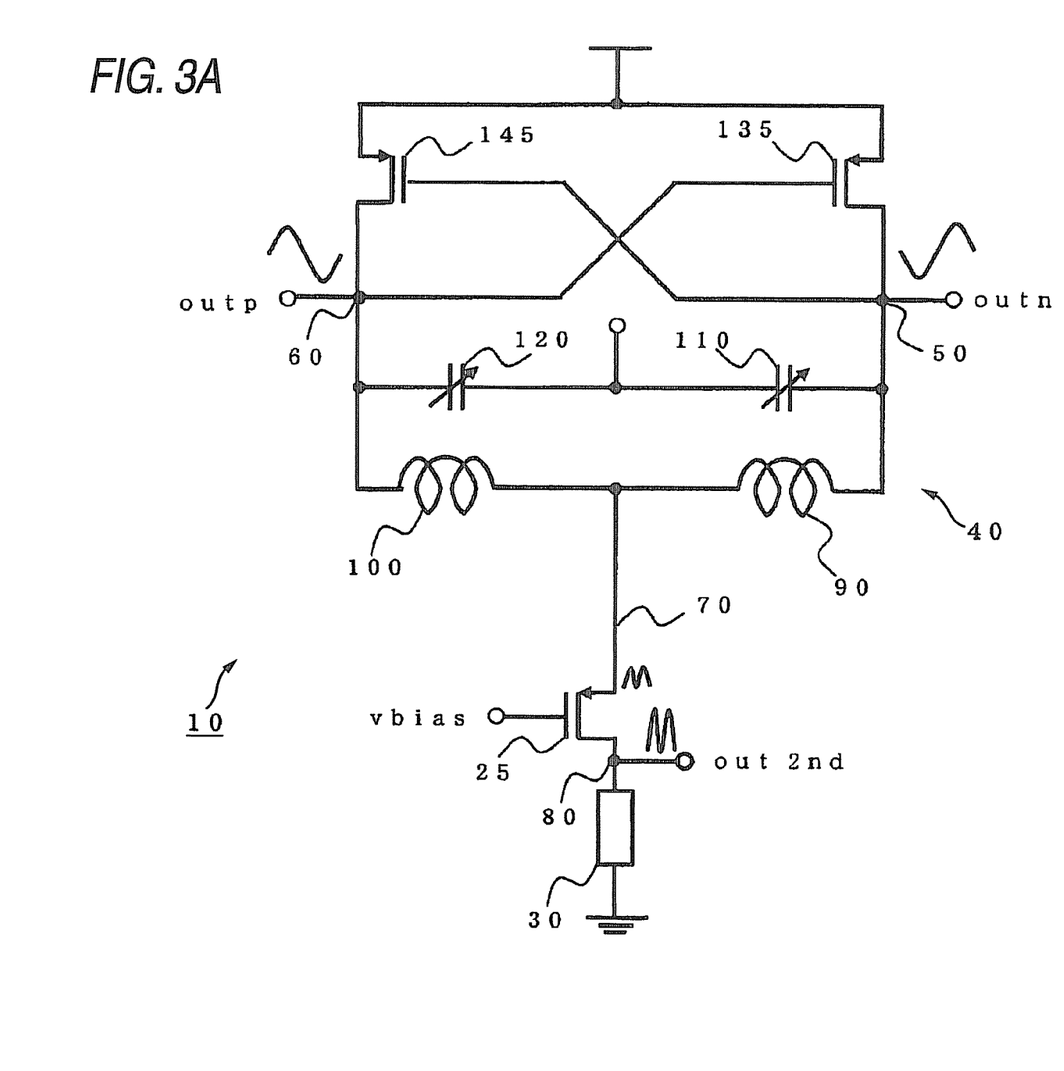
FIG. 3A is another circuit diagram showing a detailed configuration of the oscillator according to the first embodiment.
Figure 3B:
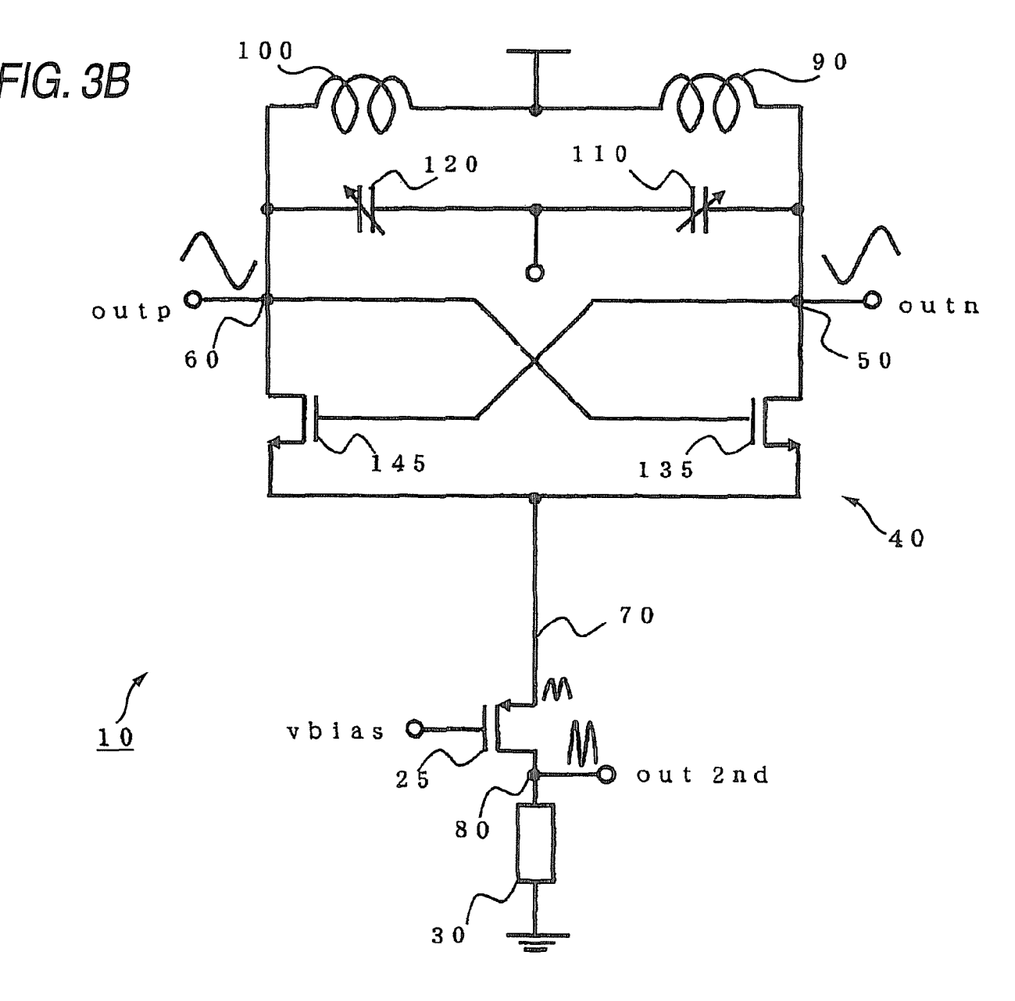
FIG. 3B is a modification of the oscillator according to the first embodiment.

The NMOS transistor 20 may be replaced by a PMOS transistor 25 (which may be called p-type MOS transistor). When the PMOS transistor 25 is used, it is possible to use a circuit configuration as shown in FIG. 3A or 3B. Even when the circuit configuration as shown in FIG. 3A or 3B is used, it is possible to use either of the NMOS transistor and the PMOS transistor. Incidentally, the aforementioned connection to the midpoint of the differential circuit can be applied to FIGS. 3A and 3B.

According to this embodiment, a harmonic signal can be output in addition to the signal with $f_0$ as an oscillation frequency of the fundamental oscillator 40. As for the output amplitude of the harmonic signal, the amplitude of the second harmonic signal output at the source terminal 70 of the PMOS transistor 25 is amplified by a common-gate circuit formed from the PMOS transistor 25 and the load element 30 so that the amplified second harmonic signal can be output at the drain terminal 80 of the PMOS transistor 25.

Because the current flowing in the common-gate amplifier (the NMOS transistor 20 or the PMOS transistor 25) which amplifies the second harmonic signal is equal to the current flowing in the oscillator 10 and the current is recycled, current consumption can be reduced. Moreover, the current flowing in the oscillator 10 can be adjusted by a bias voltage given to the gate terminal of the common-gate amplifier (the NMOS transistor 20 or the PMOS transistor 25).

Second Embodiment

Figure 4:
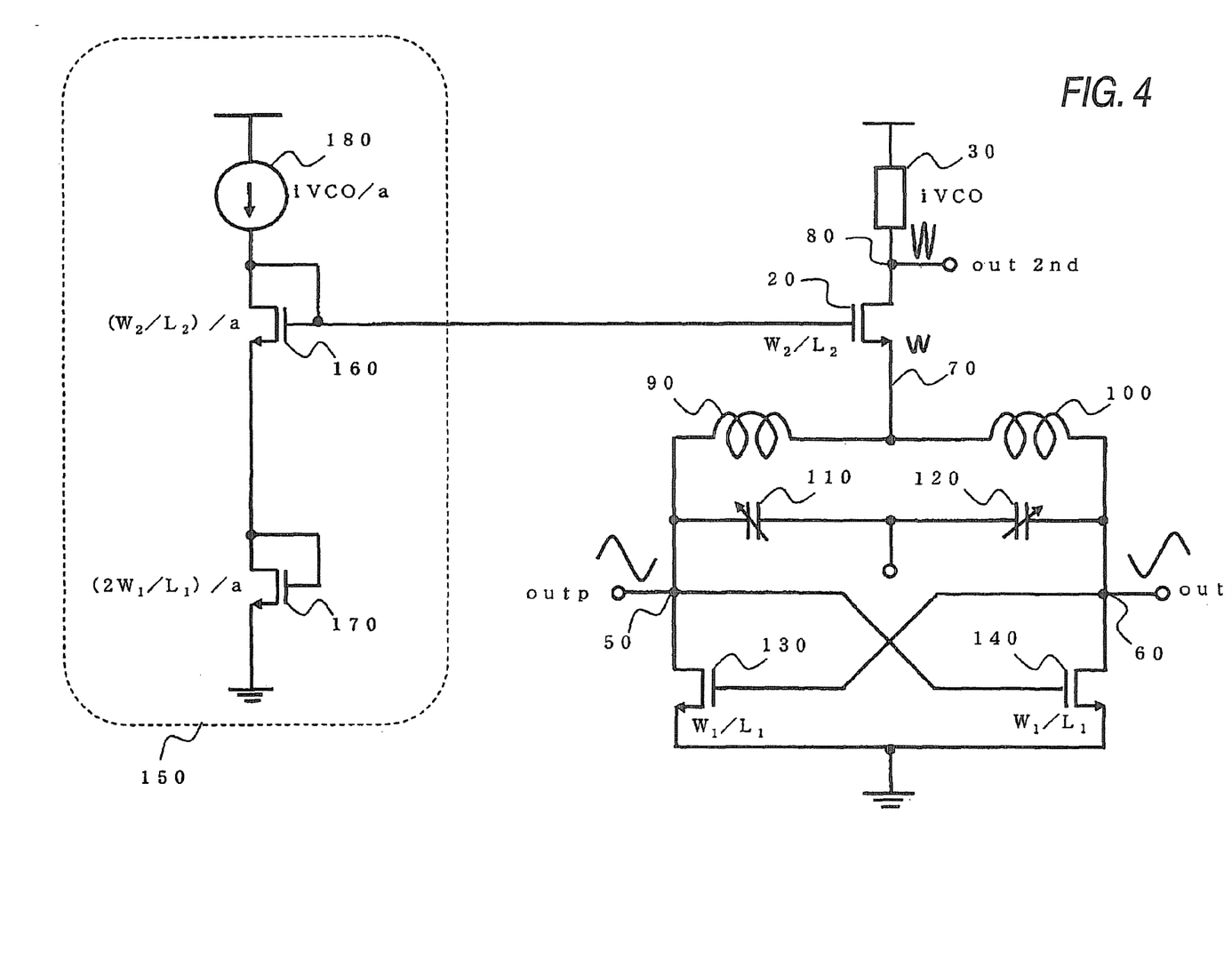
FIG. 4 is a circuit diagram showing a configuration of an oscillator according to a second embodiment.

FIG. 4 shows a circuit diagram of an oscillator according to a second embodiment of the invention.

The point of difference of this embodiment from the first embodiment lies in that a bias circuit 150 is provided to generate a gate voltage for the common-gate transistor (NMOS transistor 20) to thereby determine the amount of the current flowing in the oscillator. Incidentally, the configuration and operation of the oscillator 10 shown in the right part of FIG. 4 are the same as those in the first embodiment shown in FIG. 2A, and description thereof will be omitted.

In the oscillating circuit according to this embodiment, a gate terminal of an NMOS transistor 160 in the bias circuit 150 is connected to a gate terminal of the NMOS transistor 20 as a constituent member of the oscillator 10. Further, a current source 180 for generating a current is connected to a drain terminal of the NMOS transistor 160 while a drain terminal of another NMOS transistor 170 is connected to a source terminal of the NMOS transistor 160. The gate terminal of the NMOS transistor 160 is also connected to the current source 180. A gate terminal of the NMOS transistor 170 is connected to the source terminal of the NMOS transistor 160. Assume now that $L_1$ is the gate length of the NMOS transistors 130 and 140 in the fundamental oscillator 40, $W_1$ is the gate width thereof, $L_2$ is the gate length of the NMOS transistor 20, and $W_2$ is the gate width thereof.

The operation theories of the oscillator 10 and the bias circuit 150 according to the second embodiment will be described next. First, the operation theory of the oscillator 10 will be described.

When a DC operation is considered, the voltage drop caused by the inductor 90 or 100 as a constituent circuit member of the fundamental oscillator 40 is so negligibly little that each of the two NMOS transistors 130 and 140 can be regarded as a drain-gate-connected transistor, that is, a diode-connected circuit.

On this occasion, a DC current flowing in each circuit in the fundamental oscillator 40 is determined based on the gate lengths and gate widths of the diode-connected NMOS transistors 130 and 140 and the NMOS transistor 20 and the gate voltage of the NMOS transistor 20.

The operation theory of the bias circuit 150 will be described next.

The gate width of the NMOS transistor 170 is obtained by multiplying twice the gate width of each of the NMOS transistors 130 and 140 by 1/a. The gate width of the NMOS transistor 160 is obtained by multiplying the gate width of the NMOS transistor 20 by 1/a. Here, a is an arbitrary constant.

As described above, in a DC operation, the bias circuit 150 serves as a replica circuit 1/a times as much as the oscillator 10. That is, when the current supplied to the bias circuit 150 by the current source 180 is iVCO/a, a current of iVCO flows in the oscillator 10.

According to the second embodiment used as described above, the same effect as in the first embodiment can be obtained. The gate voltage of the NMOS transistor 160 is determined by adjustment of the current amount of the current source 180. The gate voltage of the NMOS transistor 20 in each circuit in the oscillator 10 is determined based on the gate voltage of the NMOS transistor 160. Accordingly, the current flowing in each circuit in the oscillator 10 can be adjusted.

Third Embodiment

Figure 5:
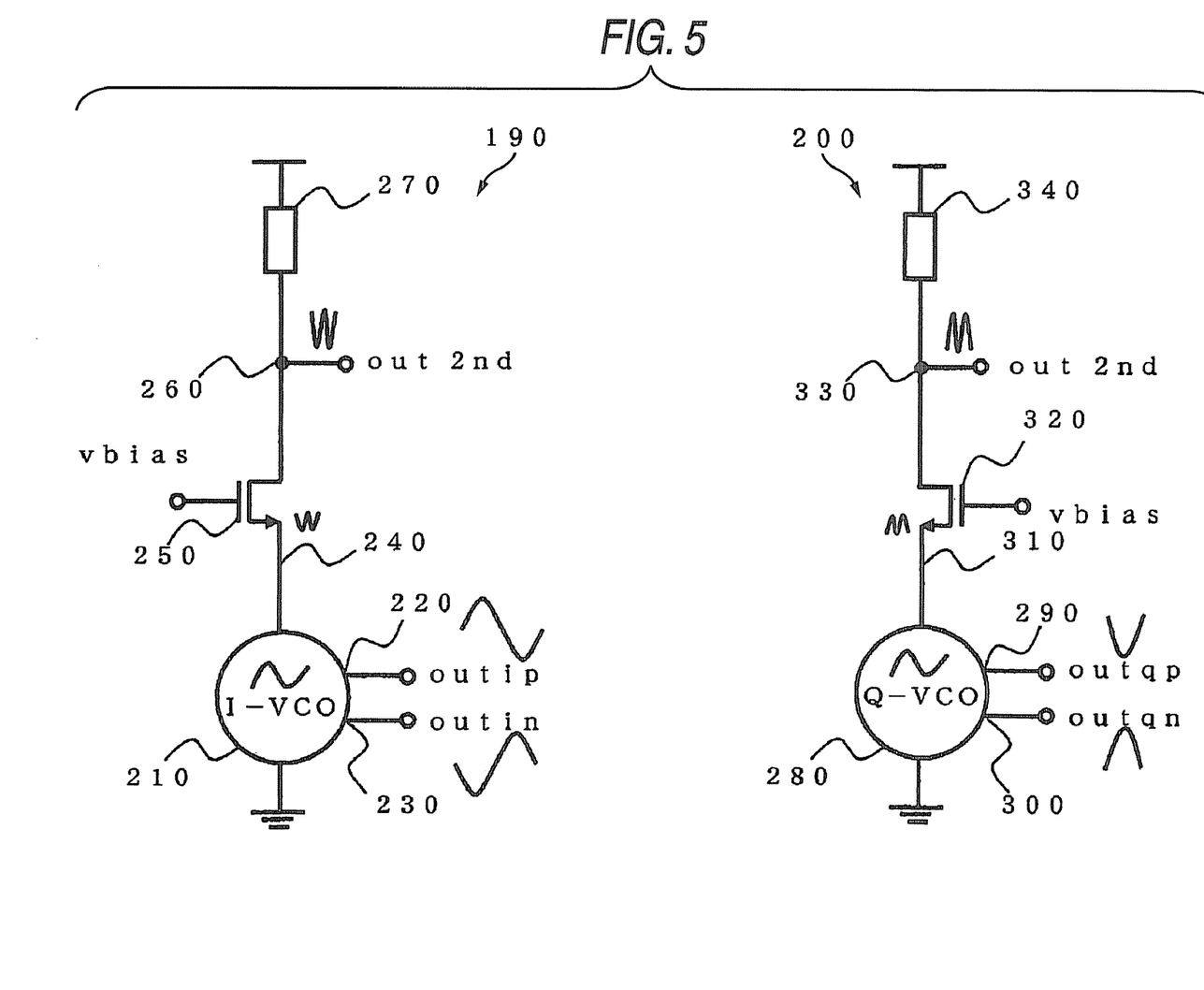
FIG. 5 is a circuit diagram showing a configuration of an oscillator according to a third embodiment.

FIG. 5 shows a circuit diagram of an oscillator according to a third embodiment of the invention.

The oscillator according to this embodiment is formed from two oscillators 190 and 200.

Circuits for giving phase differences to the oscillators 190 and 200 respectively are connected. The circuits for giving phase differences are disposed in fundamental oscillators 210 and 280 in the oscillators 190 and 200 respectively.

The circuit configuration of each of the oscillators 190 and 200 except the above description is the same as the configuration described in the first embodiment shown in FIG. 2A.

Incidentally, in this embodiment, the phase difference between a signal output from the fundamental oscillator 210 and a signal output from the fundamental oscillator 280 is set at 90 degrees.

On this occasion, the fundamental oscillator 210 operates as an I-VCO (In-phase Voltage-Controlled Oscillator) while the fundamental oscillator 280 operates as a Q-VCO (Quadrature-phase Voltage-Controlled Oscillator).

Specific circuit configurations of the fundamental oscillators 210 and 280 will be described bellow with reference to FIG. 6.

Figure 6:
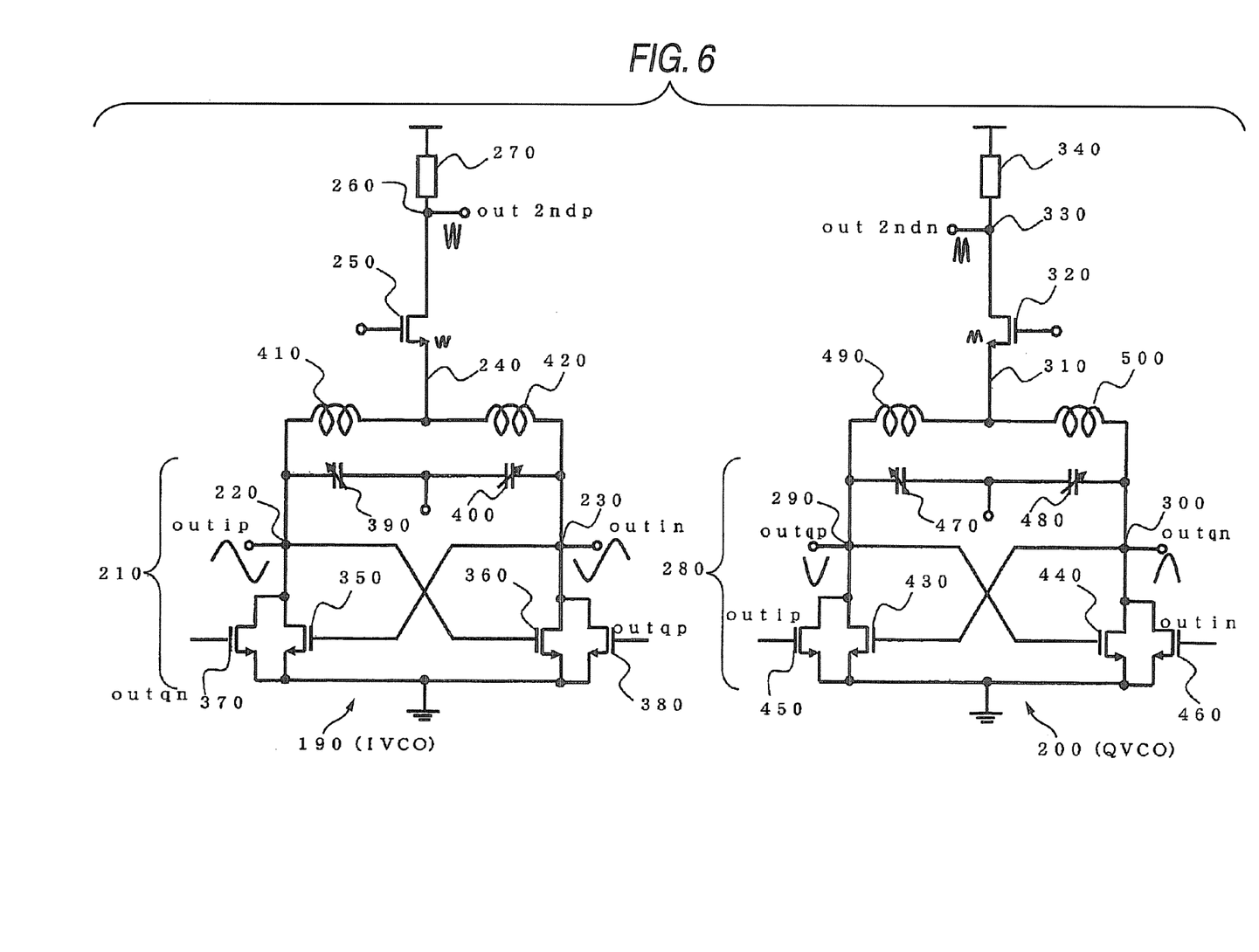
FIG. 6 is a circuit diagram showing a detailed configuration of the oscillator according to the third embodiment.

Incidentally, a left half of FIG. 6 shows the I-VCO (oscillator 190) and a right half of FIG. 6 shows the Q-VCO (oscillator 200).

As described above, the circuit configuration of each of the fundamental oscillators 210 and 280 is the same as that in the first embodiment shown in FIG. 2A, except the following point. In the fundamental oscillator 210, NMOS transistors 370 and 380 are newly connected in parallel to NMOS transistors 350 and 360, respectively. That is, the NMOS transistors 350 and 370 have drain terminals connected to each other, and source terminals connected to each other. The NMOS transistors 360 and 380 have drain terminals connected to each other, and source terminals connected to each other.

In the fundamental oscillator 280, similarly to the fundamental oscillator 210, NMOS transistors 450 and 460 are newly connected in parallel to NMOS transistors 430 and 440, respectively. In this case, drain terminals are connected to each other and source terminals are connected to each other in the same manner as described above.

Incidentally, gate terminals of the NMOS transistors 370 and 380 are connected to the drain terminals of the NMOS transistors 440 and 430, respectively. Gate terminals of the NMOS transistors 450 and 460 are likewise connected to the drain terminals of the NMOS transistors 350 and 360, respectively. The gate terminal of the NMOS transistor 370 is further connected to a terminal 300 of the oscillator 200 (Q-VCO). The gate terminal of the NMOS transistor 380 is further connected to a terminal 290 of the oscillator 200 (Q-VCO). The gate terminal of the NMOS transistor 450 is further connected to a terminal 220 of the oscillator 190 (I-VCO). The gate terminal of the NMOS transistor 460 is further connected to a terminal 230 of the oscillator 190 (I-VCO).

By these connections, the phase difference between oscillation signals output from the two fundamental oscillators 210 and 280 are set at 90 degrees.

A second harmonic signal with a frequency twice as much as the oscillation frequency of the fundamental oscillator 210 is output at a source terminal 240 of an NMOS transistor 250 connected to a midpoint between inductors 410 and 420 provided in the fundamental oscillator 210. Similarly, a second harmonic signal with a frequency twice as much as the oscillation frequency of the fundamental oscillator 280 is output at a source terminal 310 of an NMOS transistor 320 connected to a midpoint between inductors 490 and 500 provided in the fundamental oscillator 280. As a result, the phase difference between a signal output at a drain terminal 260 of the NMOS transistor 250 and a signal output at a drain terminal 330 of the NMOS transistor 320 becomes 180°. The second harmonic signals are amplified by common-gate amplifiers based on the theory described in the first embodiment and output as differential signals at the terminals 260 and 330.

Incidentally, this embodiment can be modified in the same manner as in FIGS. 2B and 3B described in the first embodiment.

According to the third embodiment used as described above, the same effect as in the first embodiment can be obtained. In addition, four-phase signals with a phase difference of 90 degrees and differential signals of a second harmonic frequency thereof can be obtained.

Fourth Embodiment

Figure 7:
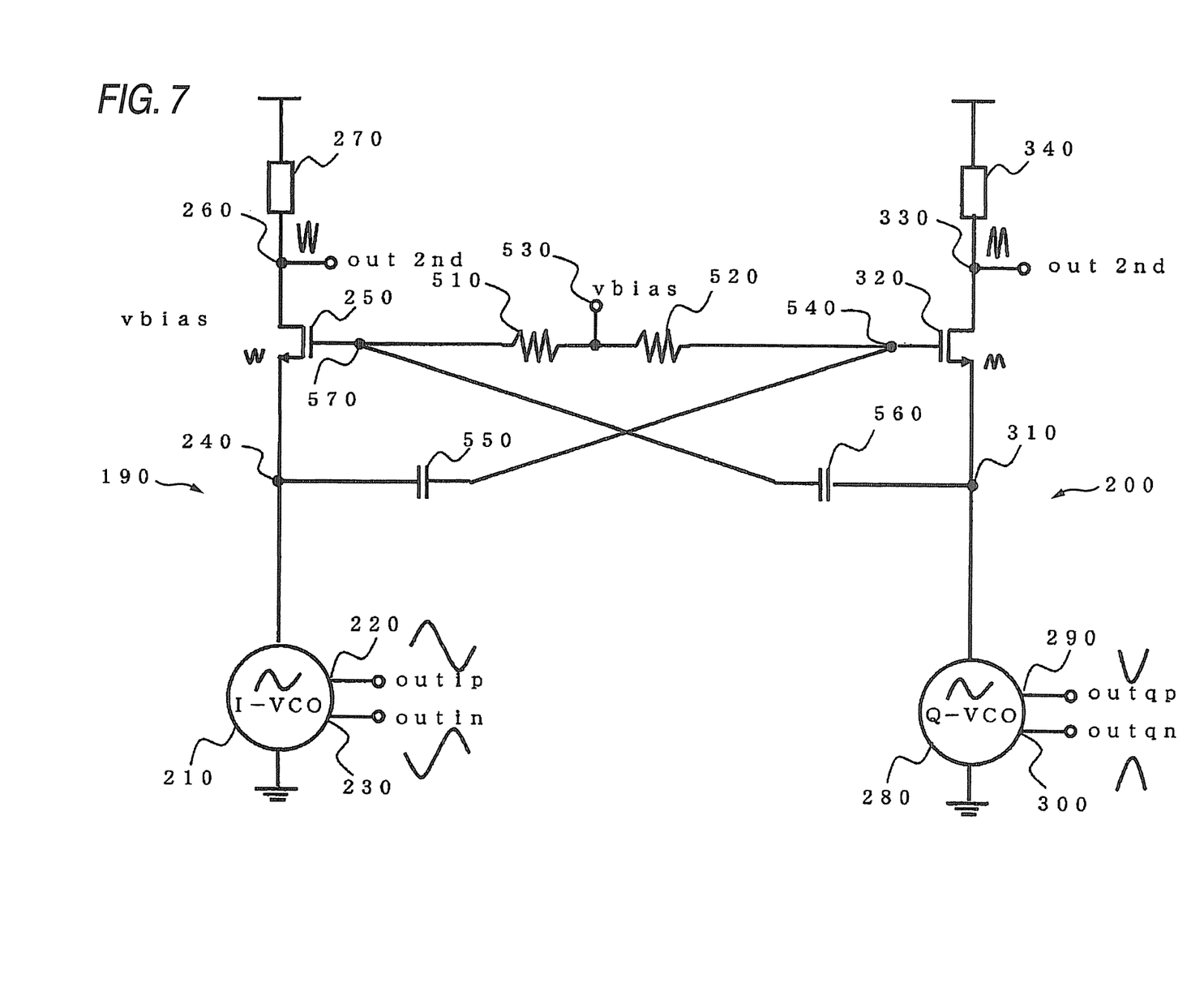
FIG. 7 is a circuit diagram showing, a configuration of an oscillator according to a fourth embodiment.

FIG. 7 is a circuit diagram showing an oscillator according to a fourth embodiment of the invention.

The oscillator according to this embodiment is formed from the oscillators 190 and 200 described in the third embodiment shown in FIG. 5. Resistors 510 and 520 are connected between a gate terminal of the NMOS transistor 250 connected to the fundamental oscillator 210 and a gate terminal of the NMOS transistor 320 connected to the fundamental oscillator 280. A bias terminal 530 is provided between the resistors 510 and 520.

A terminal 240 between the source terminal of the NMOS transistor 250 and the fundamental oscillator 210 is connected, through a capacitor 550, to a terminal 540 between the gate terminal of the NMOS transistor 320 and the resistor 520. A terminal 310 between the source terminal of the NMOS transistor 320 and the fundamental oscillator 280 is connected, through a capacitor 560, to a terminal 570 between the gate terminal of the NMOS transistor 250 and the resistor 510. The structure except the above description is the same as that in the third embodiment, and description thereof will be omitted.

The operation theory of the fourth embodiment will be described next.

The NMOS transistor 250 and the load element 270 form a common-gate circuit. The gate DC voltage of the NMOS transistor 250 is a voltage supplied from the bias terminal 530 through the resistor 510. In an AC operation, the gate voltage applied to the NMOS transistor 250 has a reverse phase relation to the source voltage, so that the gate voltage has an effect of further amplifying the second harmonic output from the drain terminal 260 of the NMOS transistor 250. This is because, with respect to the drain terminal 260 of the NMOS transistor 250, an AC current component of the source voltage of the NMOS transistor 320 as a constituent member of the oscillator 200 is transmitted to the gate terminal 570 of the NMOS transistor 250 through the capacitor 560 to thereby increase the gate-source voltage of the NMOS transistor 250. The same operation can be carried out by the NMOS transistor 320.

According to the fourth embodiment used as described above, the same effect as in the first embodiment can be obtained and an effect of amplifying the second harmonic signal can be obtained.

Fifth Embodiment

Figure 8:
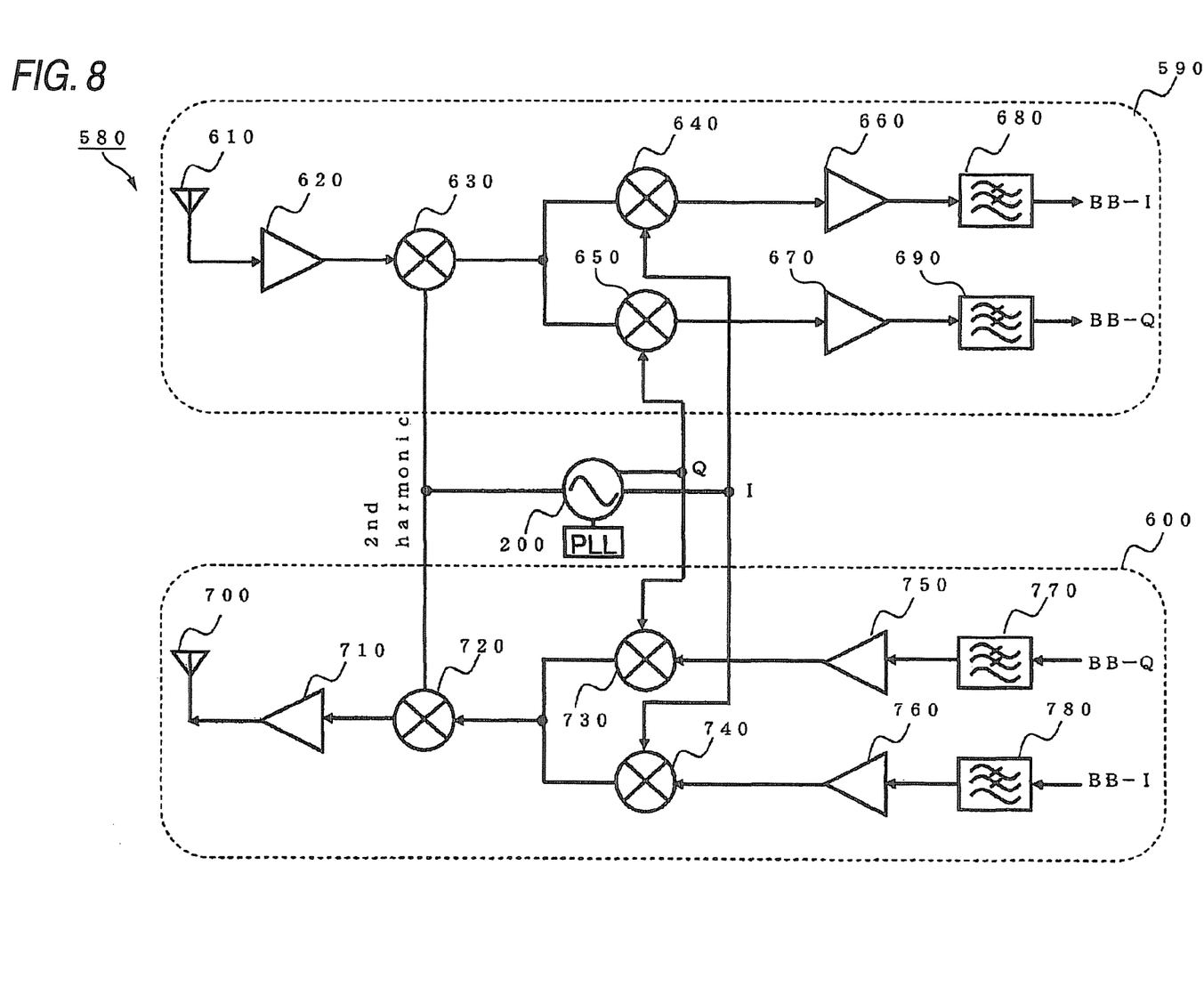
FIG. 8 is a circuit diagram showing a configuration of an oscillator according to a fifth embodiment.

FIG. 8 is a circuit diagram showing an oscillator according to a fifth embodiment of the invention.

FIG. 8 is a block diagram showing a radio communication apparatus 580 using the oscillator 200 (QVCO) described in the third embodiment shown in FIG. 5.

The radio communication apparatus 580 according to this embodiment includes a receiver 590, the oscillator 200 (local oscillator), and a transmitter 600.

The receiver 590 has an antenna 610 for receiving an RF signal (radio signal), a low noise amplifier 620, mixer circuits 630, 640 and 650, amplifiers 660 and 670, and low-pass filters 680 and 690.

The transmitter 600 has an antenna 700 for transmitting an RF signal, a power amplifier 710, mixer circuits 720, 730 and 740, amplifiers 750 and 760, and low-pass filters 770 and 780.

The oscillator 200 outputs an I+ signal and an I− signal to the mixer circuit 640 of the receiver 590 and the mixer circuit 740 of the transmitter 600 and outputs a Q+ signal and a Q− signal to the mixer circuit 650 of the receiver 590 and the mixer circuit 730 of the transmitter 600. Incidentally, the Q± signals indicate signals with a phase difference of 90 degrees from the I± signals. The oscillator 200 further outputs a second harmonic signal ('2nd harmonic' shown in FIG. 8) to the mixer circuit 630 of the receiver 590 and the mixer circuit 720 of the transmitter 600.

The operation theory of the receiver 590 will be described next. Incidentally, the transmitter 600 performs signal processing reverse in operation to the receiver 590 and description of the transmitter 600 will be omitted.

The low noise amplifier 620 amplifies the RF signal received through the antenna 610. The mixer circuit 630 generates an IF signal by multiplying the RF signal amplified by the low noise amplifier 620 by the second harmonic signal output from the oscillator 200.

The mixer circuit 640 generates a baseband (BB) signal by multiplying the IF signal generated by the mixer circuit 630 through the antenna 610 and the low noise amplifier 620 due to reception of the radio signal, by the I+ signal and the I− signal output from the oscillator 200.

The amplifier 660 amplifies the BB signal generated by the mixer circuit 640. The low-pass filter 680 removes a high-frequency component from the BB signal. Thus, an I-ch signal is generated.

On the other hand, the mixer circuit 650 generates a BB signal by multiplying the IF signal generated by the mixer circuit 630 by the Q+ signal and the Q− signal output from the oscillator 200 in the same manner. The amplifier 670 amplifies the BB signal and the low-pass filter 690 processes the amplified signal to thereby generate a Q-ch signal. Each of the I-ch signal and the Q-ch signal is subjected to signal processing such as A/D conversion, demodulation, etc.

As shown in FIG. 8, the second harmonic signal ('2nd harmonic' shown in FIG. 8) is provided as differential signals having a frequency twice as much as the frequency of each of the I+, I−, Q+ and Q− signals (oscillation signals output from the PLL (Phase Locked Loop) circuit). Accordingly, when the second harmonic signals are output to the mixer circuits 630 and 720, two-stage frequency conversion can be achieved by one PLL circuit.

Specifically, the case where a radio signal of 60 GHz is received will be described as an example. In this case, assuming that the oscillator 200 outputs oscillation signals of 20 GHz, then the second harmonic signals Ic and Qc are signals of 40 GHz. When the mixer circuit 630 multiplies the radio signal of 60 GHz by the second harmonic signals of 40 GHz, an IF signal of 20 GHz is obtained. When the mixer circuits 660 and 670 multiply the IF signal of 20 GHz by the oscillation signals (I+, I−, Q+ and Q− signals) of 20 GHz output from the oscillator 200, a BB signal is obtained.

By use of the oscillator 200 according to this embodiment, the second harmonic signals can be output to the mixer circuits 630 and 720 without arrangement of a plurality of oscillators.

That is, in addition to achievement of the effect of amplifying the second harmonic signals, the circuit scale of the radio communication apparatus can be reduced because a plurality of oscillators are not required in a radio system for performing two-stage frequency conversion. Although a radio communication apparatus using a frequency divider to reduce the number of oscillators to one is known in the radio system for performing two-stage frequency conversion, it is necessary to use the frequency divider for obtaining signals with different frequencies. In the radio communication apparatus according to this embodiment, it is however unnecessary to use such a frequency divider. Besides the radio communication apparatus 580 according to this embodiment, the oscillator according to the first embodiment can be applied to a radio communication apparatus like this embodiment as long as the radio communication apparatus can perform two-stage frequency conversion.

Incidentally, the invention is not limited to the aforementioned embodiments per se. Constituent members may be modified to be put into shape without departing from the gist of the invention in a practical stage. A plurality of constituent members disclosed in the embodiments may be combined suitably to form various inventions. For example, some constituent members may be removed from all the constituent members disclosed in each embodiment. In addition, constituent members disclosed in different embodiments may be combined suitably.

As described with reference to the above embodiments, there is provided an oscillating circuit which is possible to obtain harmonic signals high in signal amplification, and a radio communication apparatus using the oscillating circuit.

What is claimed is:

1. An oscillating circuit comprising:
a first MOS transistor having a first drain terminal and a first source terminals bias current being output from the first source terminal;
a load element coupled to the first drain terminal; and
an oscillator coupled to the first source terminal, the oscillator oscillating in accordance with the bias current to output a fundamental signal and a harmonic signal,
wherein the first MOS transistor amplifies the harmonic signal to output the amplified harmonic signal from the first drain terminal.

2. The circuit according to claim 1, wherein the oscillator includes a differential circuit having a midpoint, and
the first source terminal is connected to the midpoint.
3. The circuit according to claim 1, wherein the oscillator includes:
a resonance portion having:
a first inductor;
a second inductor serially connected to the first inductor;
a midpoint disposed between the first inductor and second inductor and connected to the first inductor, the second inductor, and the first source terminal;
a first capacitor;
a second capacitor serially connected to the first capacitor, the first inductor and the second inductor being connected in parallel to the first capacitor and the second capacitor;
a first terminal configured to output a positive phase signal and connected to one end of the resonance portion;
a second terminal configured to output a negative phase signal and connected to the other end of the resonance portion;
a second MOS transistor having a second source terminal, a second drain terminal connected to the first terminal, and a second gate terminal connected to the second terminal, the second MOS transistor having the same polarity as the first MOS transistor; and
a third MOS transistor having a third gate terminal connected to the first terminal, a third drain terminal connected to the second terminal, and a third source terminal connected to the second source terminal, the third MOS transistor having the same polarity as the first MOS transistor.
4. The circuit according to claim 1, wherein the oscillator includes:
a resonance portion having:
a first inductor;
a second inductor serially connected to the first inductor;
a first capacitor; and
a second capacitor serially connected to the first capacitor, the first inductor and the second inductor being connected in parallel to the first capacitor and the second capacitor;
a first terminal configured to output a positive phase signal and connected to one end of the resonance portion;
a second terminal configured to output a negative phase signal of the fundamental signal and connected to the other end of the resonance portion;
a second MOS transistor having a second source terminal, a second drain terminal connected to the first terminal, and a second gate terminal connected to the second terminal, the second MOS transistor having a polarity different from a polarity of the first MOS transistor; and
a third MOS transistor having a third gate terminal connected to the first terminal, a third drain terminal connected to the second terminal, and a third source terminal connected to the first source terminal and the second source terminal, the third MOS transistor having a polarity different from the polarity of the first MOS transistor.
5. The circuit according to claim 3 further comprising:
a fourth MOS transistor having a fourth source terminal, a fourth gate terminal, and a fourth drain terminal connected to the fourth gate terminal and the first gate terminal, the fourth MOS transistor being an n-type MOS transistor;
a current source connected to the fourth drain terminal; and
a fifth MOS transistor having a fifth gate terminal and a fifth drain terminal both connected to the fourth source terminal, the fifth MOS transistor being an n-type MOS transistor.
6. An oscillating circuit comprising:
a first oscillating module including:
a first MOS transistor having a first drain terminal and a first source terminal, a bias current being output from the first source terminal;
a first load element coupled to the first drain terminal;
a first oscillator coupled to the first source terminal, the first oscillator oscillating in accordance with the bias current to output a first fundamental signal and a first harmonic signal, wherein the first MOS transistor amplifies the harmonic signal to output the amplified harmonic signal from the first drain terminal, the first oscillator including:
a first resonance portion having:
a first inductor;
a second inductor serially connected to the first inductor;
a first midpoint disposed between the first inductor and second inductor and connected to the first inductor, the second inductor, and the first source terminal;
a first capacitor; and
a second capacitor serially connected to the first capacitor, the first inductor and the second inductor being connected in parallel to the first capacitor and the second capacitor;
a first terminal configured to output a first positive phase signal and connected to one end of the first resonance portion;
a second terminal configured to output a first negative phase signal and connected to the other end of the first resonance portion;
a second MOS transistor having a second drain terminal connected to the first terminal, a second gate terminal connected to the second terminal, and a second source terminal;
a third MOS transistor having a third gate terminal connected to the first terminal, a third drain terminal connected to the second terminal, and a third source terminal connected to the second source terminal;
a fourth MOS transistor having a fourth drain terminal connected to the second drain terminal and a fourth source terminal connected to the second source terminal; and
a fifth MOS transistor having a fifth drain terminal connected to the third drain terminal and a fifth source terminal connected to the third source terminal; and
a second oscillating module including:
a sixth MOS transistor having a sixth drain terminal and a sixth source terminal;
a second load element connected to the sixth drain terminal;
a second oscillator connected to the sixth source, configured to output a second fundamental signal and a second harmonic signal, the second oscillator including:
a second resonance portion having:
a third inductor;
a fourth inductor serially connected to the third inductor;

a second midpoint disposed between the third inductor and the fourth inductor and connected to the third inductor, the fourth inductor, and the sixth source terminal;
a third capacitor; and
a fourth capacitor serially connected to the third capacitor, the third inductor and the fourth inductor being connected in parallel to the third capacitor and the fourth capacitor;
a third terminal configured to output a second positive phase signal that has 90 degrees phase difference with respect to the first positive phase signal and connected to one end of the second resonance portion;
a fourth terminal configured to output a second negative phase signal that has 90 degrees phase difference with respect to the first negative phase signal and connected to the other end of the second resonance portion;
a seventh MOS transistor having a seventh drain terminal connected to the third terminal, a seventh gate terminal connected to the fourth terminal, and a seventh source terminal;
an eighth MOS transistor having a eighth gate terminal connected to the third terminal, a eighth drain terminal connected to the fourth terminal, and a eighth source terminal connected to the seventh source terminal;
a ninth MOS transistor having a ninth drain terminal connected to the seventh drain terminal and a ninth source terminal connected to the seventh source terminal; and
a tenth MOS transistor having a tenth drain terminal connected to the eighth drain terminal and a tenth source terminal connected to the eighth source terminal,
wherein the second MOS transistor, the third MOS transistor, the fourth MOS transistor, the fifth MOS transistor, the sixth MOS transistor, the seventh MOS transistor, the eighth MOS transistor, the ninth MOS transistor, and the tenth MOS transistor have the same polarity as the first MOS transistor,
the fourth gate terminal is connected to the fourth terminal,
the fifth gate terminal is connected to the third terminal,
the ninth gate terminal is connected to the first terminal, and
the tenth gate terminal is connected to the second gate terminal.

7. The circuit according to claim 6 further comprising:
a fifth terminal formed between the sixth source terminal and the second oscillator;
a fifth capacitor connected between the fifth terminal and a gate terminal of the first MOS transistor;
a sixth terminal formed between the first source terminal and the first oscillator;
a sixth capacitor connected between the sixth terminal and a gate terminal of the sixth MOS transistor;
a seventh terminal formed between the fifth capacitor and the gate terminal of the first MOS transistor;
an eighth terminal formed between the sixth capacitor and the gate terminal of the sixth MOS transistor;
a first resistor and a second resistor serially connected between the seventh terminal and the eighth terminal; and
a bias terminal formed between the first resistor and the second resistor.

8. A radio communication apparatus comprising:
an oscillating circuit including:
a first oscillating module including:
a first MOS transistor having a first drain terminal and a first source terminal, a bias current being output from the first source terminal;
a first load element coupled to the first drain terminal;
a first oscillator coupled to the first source terminal, the first oscillator oscillating in accordance with the bias current to output a first fundamental signal and a first harmonic signal, wherein the first MOS transistor amplifies the first harmonic signal to output the amplified harmonic signal from the first drain terminal, the first oscillator including:
a first resonance portion having:
a first inductor;
a second inductor serially connected to the first inductor;
a first midpoint disposed between the first inductor and second inductor and connected to the first inductor, the second inductor, and the first source terminal;
a first capacitor; and
a second capacitor serially connected to the first capacitor, the first inductor and the second inductor being connected in parallel to the first capacitor and the second capacitor;
a first terminal configured to output a first positive phase signal and connected to one end of the first resonance portion;
a second terminal configured to output a first negative phase signal and connected to the other end of the first resonance portion;
a second MOS transistor having a second drain terminal connected to the first terminal, a second gate terminal connected to the second terminal, and a second source terminal;
a third MOS transistor having a third gate terminal connected to the first terminal, a third drain terminal connected to the second terminal, and a third source terminal connected to the second source terminal;
a fourth MOS transistor having a fourth drain terminal connected to the second drain terminal and a fourth source terminal connected to the second source terminal; and
a fifth MOS transistor having a fifth drain terminal connected to the third drain terminal and a fifth source terminal connected to the third source terminal; and
a second oscillating module including:
a sixth MOS transistor having a sixth drain terminal and a sixth source terminal;
a second load element connected to the sixth drain terminal;
a second oscillator connected to the sixth source, configured to output a second fundamental signal and a second harmonic signal, the second oscillator including:
a second resonance portion having:
a third inductor;
a fourth inductor serially connected to the third inductor;
a second midpoint disposed between the third inductor and the fourth inductor and connected to the third inductor, the fourth inductor, and the sixth source terminal;
a third capacitor; and
a fourth capacitor serially connected to the third capacitor, the third inductor and the fourth inductor being connected in parallel to the third capacitor and the fourth capacitor;
a third terminal configured to output a second positive phase signal that has 90 degrees phase difference with respect to the first positive phase signal and connected to one end of the second resonance portion;

a fourth terminal configured to output a second negative phase signal that has 90 degrees phase difference with respect to the first negative phase signal and connected to the other end of the second resonance portion;

a seventh MOS transistor having a seventh drain terminal connected to the third terminal, a seventh gate terminal connected to the fourth terminal, and a seventh source terminal;

an eighth MOS transistor having an eighth gate terminal connected to the third terminal, an eighth drain terminal connected to the fourth terminal, and an eighth source terminal connected to the seventh source terminal;

a ninth MOS transistor having a ninth drain terminal connected to the seventh drain terminal and a ninth source terminal connected to the seventh source terminal; and a tenth MOS transistor having a tenth drain terminal connected to the eighth drain terminal and a tenth source terminal connected to the eighth source terminal, wherein the second MOS transistor, the third MOS transistor, the fourth MOS transistor, the fifth MOS transistor, the sixth MOS transistor, the seventh MOS transistor, the eighth MOS transistor, the ninth MOS transistor, and the tenth MOS transistor have the same polarity as the first MOS transistor, the fourth gate terminal is connected to the fourth terminal, the fifth gate terminal is connected to the third terminal, the ninth gate terminal is connected to the first terminal, and the tenth gate terminal is connected to the second gate terminal;

a first antenna through which a first radio signal is received;

a first low noise amplifier which amplifies the first radio signal;

a first mixer circuit which multiplies the first radio signal amplified by the first low noise amplifier by the first harmonic signal to generate a first IF signal;

a second mixer circuit which multiplies the first IF signal by I± signals output from the first and second terminals or the third and fourth terminals respectively to generate a first BB signal;

a third mixer circuit which multiplies the first IF signal by Q± signals generated from the oscillating circuit to generate a second BB signal;

a fourth mixer circuit which multiplies the I± signals by a third BB signal to generate a second IF signal;

a fifth mixer circuit which multiplies the Q± signals by a fourth BB signal to generate a third IF signal;

a sixth mixer circuit which multiples the first harmonic signal by a fourth IF signal obtained by adding up the second and third IF signals to generate a second radio signal;

a first power amplifier which amplifies the second radio signal; and a second antenna through which the second radio signal amplified by the first power amplifier is transmitted.

* * * * *